(12) United States Patent
Kirby et al.

(10) Patent No.: US 8,514,990 B2
(45) Date of Patent: Aug. 20, 2013

(54) AUTOMATIC GAIN CONTROL DEVICE FOR SATELLITE POSITIONING RECEIVERS

(75) Inventors: Estelle Kirby, Peyrus (FR); Marc Revol, Upic (FR)

(73) Assignee: Thales, Neuilly-sur-Seine (FR)

( * ) Notice: Subject to any disclaimer, the term of this patent is extended or adjusted under 35 U.S.C. 154(b) by 0 days.

(21) Appl. No.: 13/323,280

(22) Filed: Dec. 12, 2011

(65) Prior Publication Data

US 2012/0314821 A1    Dec. 13, 2012

(30) Foreign Application Priority Data

Dec. 23, 2010 (FR) ...................... 10 05085

(51) Int. Cl.
*H04L 27/08* (2006.01)

(52) U.S. Cl.
USPC .............. 375/345; 330/278; 342/92; 341/139

(58) Field of Classification Search
USPC ........... 375/345; 330/278; 342/92; 341/139
See application file for complete search history.

(56) References Cited

U.S. PATENT DOCUMENTS

| 5,101,416 | A | 3/1992 | Fenton |
| 2008/0272847 | A1* | 11/2008 | Dally et al. ................... 330/279 |
| 2009/0004990 | A1 | 1/2009 | Renard et al. |
| 2009/0104883 | A1 | 4/2009 | Renard et al. |
| 2011/0176639 | A1 | 7/2011 | Nakayama |

* cited by examiner

*Primary Examiner* — Curtis Odom
(74) *Attorney, Agent, or Firm* — Michael J. Donohue; Davis Wright Tremaine LLP

(57) ABSTRACT

Automatic gain control device for satellite positioning receivers characterized in that it comprises means for estimating the temporal occupancy rate of the pulses within the useful band, closed-loop control of the automatic gain control being applied in an optimal manner as a function of the said temporal occupancy rate, in such a manner as to reduce the influence of the pulsed interference within the band and out-of-band; notably, an AGC decision module returns a control signal for the attention of a non-linear function module applying a given weighting to the signals resulting from a comparison between the power or the amplitude of digitized input signals and a setpoint threshold value $C_{AGC}$.

11 Claims, 5 Drawing Sheets

AUTOMATIC GAIN CONTROL DEVICE FOR SATELLITE POSITIONING RECEIVERS

BACKGROUND OF THE INVENTION

1. Technical Field

The present invention relates to an automatic gain control device for satellite positioning receivers. It is notably applicable to Global Navigation Satellite Systems, or GNSS, and may be implemented in any navigation receiver.

2. Discussion on the Background

A satellite positioning system, or GNSS, comprises a plurality of signal transmitters disposed on as many satellites forming a constellation. Examples of satellite navigation systems of the GNSS type may be mentioned, notably: the system commonly denoted by the acronym "GPS" for "Global Positioning System", and the system commonly denoted "Galileo". A minimum of four positioning satellites allow a mobile receiver capable of processing the received signals coming from the latter to deliver position data from the receiver, in terms of geographical coordinates (x,y,z) at a given time instant t. The data transmitted by the positioning satellites occupy a wider bandwidth than that required by the data rate to be transmitted, with the aim of reducing the influence of interfering signals, and of reducing the power levels of the transmitted signals in such a manner that the latter are masked in the background noise. Thus, according to techniques known per se, the spectrum of the transmitted signals is a spread spectrum, a carrier wave being modulated by a data signal superimposed onto a high-frequency pseudo-random noise spread signal. A correlation of the received signals with local codes allows the useful signal to be extracted from the noise. The correlation function of a GNSS receiver requires a signal-to-noise ratio that is sufficient to allow the demodulation of the data, and to allow code and phase tracking of the signal.

A certain number of frequency bands are allocated to navigation systems of the GNSS type. Recently, new frequency bands have been allocated to systems of the GPS type referred to as "modernized" GPS systems and to the Galileo system, respectively: the frequency bands L5 and E5a, E5b. The latter frequency bands have the particular feature of already being allocated to pulsed radio-navigation systems, amongst which the system commonly denoted by the acronym DME, corresponding to "Distance Measuring Equipment", may notably be mentioned. Furthermore, these frequency bands are also at the limit of a frequency band allocated to radar systems, amongst which are radar systems such as meteorological radar or primary radar systems typically operating in a frequency band adjacent to the E5b band.

Thus, from the point of view of a satellite navigation receiver of the GNSS type, and notably of the modernized GPS or Galileo type, the signals coming from radio-navigation systems such as DME, or from radars, are respectively considered as interference in the frequency bands of interest, or as out-of-band interference. The aforementioned radio-navigation and radar systems are usually fixed on the ground, and an aircraft may be subjected to various types of pulsed interference depending on the areas over which it flies. Furthermore, this pulsed interference is very powerful in transmission; thus, when an aircraft overflies for example the European and American continents, within which there is a high concentration of sources of interferences, the occupancy rate of the pulses can be high, even greater than 100% where there is overlapping of the pulsed interference sources.

As regards the protection against interference associated with the presence of undesirable signals, the aforementioned interference sources present difficulties in the time processing by the GNSS receiver. Notably, a GNSS receiver comprises a system for Adaptive Gain Control, commonly denoted by the acronym AGC, acting on the radiofrequency signal received via an antenna and after pre-amplification, allowing the coding of the input radiofrequency signal to be optimized downstream within the dynamic range of an Analogue-Digital Converter, commonly denoted by the acronym ADC. Certain pulsed interference scenarios destabilize the AGC and render difficult or even impossible any digital processing downstream of the ADC.

The GNSS receivers must consequently be robust to pulsed interference sources in the GNSS useful band with high repetition rates, which correspond to pulsed interference scenarios for example of the DME type, and also be robust to high-power pulsed interference outside of the useful band, notably produced by radar systems.

One known solution that aims to enable GNSS receivers to overcome interference effects caused by pulses is the technique denoted by the term "blanking", which consists in identifying the interfering signal and in eliminating the received signal affected by the latter from the later processing operations. This solution is unworkable when the interference density increases to the point of covering the useful signal virtually continuously. In this case, the blanking leads to any useful signal being eliminated at the same time as the interfering signal. This type of scenario is likely to happen in a large part of the European air space, notably at an altitude of around 40,000 feet where the number of DME beacons seen by an aircraft can be around 60 at the times of maximum density of traffic. In order to improve the efficiency of the blanking, the band can be divided up into several sub-bands and the blanking applied over each of the sub-bands, which, for a given level of interference, allows a larger part of the useful signal to remain and hence improves the signal-to-noise ratio.

In both cases, a noise reference needs to be available which allows the bias in estimation of the thermal noise, which appears in the dense interference scenarios, to be overcome. One solution consists in calibrating a noise reference; however, this solution is not stable either in time or in temperature, or with respect to the dynamic processes to which the receiver is subjected.

Thus, according to an improved technique described in the Patent application published under the reference FR 2,916, 589, an estimation of the thermal noise is provided without recourse to the calibration. According to this technique, the AGC is closed-loop controlled by the probability density function of the power or of the amplitude of the radiofrequency signal, and is based on the principle that the left-hand part of the probability density curve as a function of the power or of the amplitude is not or is hardly affected by interference pulses within the useful band. This technique turns out to be very effective for pulses within the useful band, even for high repetition rates. However, this technique proves to be less effective with regard to scenarios of high out-of-band pulse occupancy rates, saturating the pre-amplifier that operates over the whole L band. When the latter is saturated by a pulse within the L band but outside of the useful band, its gain collapses over the whole L range. The AGC estimator is thus biased and the useful signal is therefore no longer amplified, and it becomes difficult or even impossible to extract it from the noise by correlation.

SUMMARY OF THE INVENTION

One aim of the present invention is to overcome at least the aforementioned drawbacks, by providing an automatic gain control device for GNSS receivers that is best adapted to the thermal noise, in the various possible interference scenarios, notably in the presence of pulses within the band and out-of-band exhibiting variable, and possibly very high, occupancy rates.

For this purpose, a subject of the invention is an automatic gain control device for satellite positioning receivers comprising at least one radiofrequency module returning a filtered radiofrequency signal representative of the signals received by an antenna and amplified by a variable gain amplifier comprised in the radiofrequency module, an analogue-digital converter returning digitized samples of the radiofrequency signal, and a signal processing module processing the digitized signal, the automatic gain control device being implemented in the signal processing module and performing a closed-loop control returning a gain control signal for the variable gain amplifier, and comprising means for estimating the temporal occupancy rate of the pulses within the useful band, means for estimating a characteristic quantity chosen from within the group comprising the amplitude and the power of the sampled signals, the temporal occupancy rate of the pulses within the useful band determining the weightings respectively applied to the negative and positive differences resulting from a comparison between the characteristic quantity of the digitized samples and a setpoint value $C_{AGC}$, by a non-linear function module, the signals coming from the non-linear function module being integrated over a given period in order to form the said gain control signal.

In one embodiment of the invention, the determination of the weightings can be implemented in a decision module receiving at its input a value for pulse occupancy rate in the useful band, and returning at its output weighting information to the said non-linear function module. In one embodiment of the invention, the non-linear function module can apply the said weightings based on a truth table for correspondence between temporal occupancy rates of the pulses within the useful band, and adjustments to the respective rates from weightings applied to the said negative and positive differences.

In one embodiment of the invention, the said weighting adjustments can apply a weighting rate of X % to the negative differences and a weighting rate of (1−X) % to the positive differences, X being in the range between 0 and 100, and being higher the greater the temporal occupancy rate of the pulses within the useful band.

In one embodiment of the invention, the automatic gain control device can comprise means for adjustment of the setpoint value $C_{AGC}$ configured for adjusting the value of the setpoint $C_{AGC}$ as a function of the temporal occupancy rate of the pulses within the useful band.

In one embodiment of the invention, the determination of the temporal occupancy rate of the pulses within the useful band can be implemented in a module for detection of pulses within the useful band comprised in the said signal processing module.

In one embodiment of the invention, the determination of the temporal occupancy rate of the pulses within the useful band can be implemented in a module for analyzing the pulses within the useful band comprising at least one filter spectrally adapted to predetermined types of pulsed interference.

In one embodiment of the invention, the said feedback control loop can comprise an AGC loop gain module whose adjustable gain determines the response time of the feedback control loop.

In one embodiment of the invention, the gain of the loop gain module can be adjusted by a control signal returned by the decision module as a function of the temporal occupancy rate of the pulses within the useful band.

BRIEF DESCRIPTION OF THE DRAWINGS

Other features and advantages of the invention will become apparent upon reading the description, presented by way of example and with regard to the appended drawings, which show.

DESCRIPTION OF THE PREFERRED EMBODIMENTS

Figure 1:
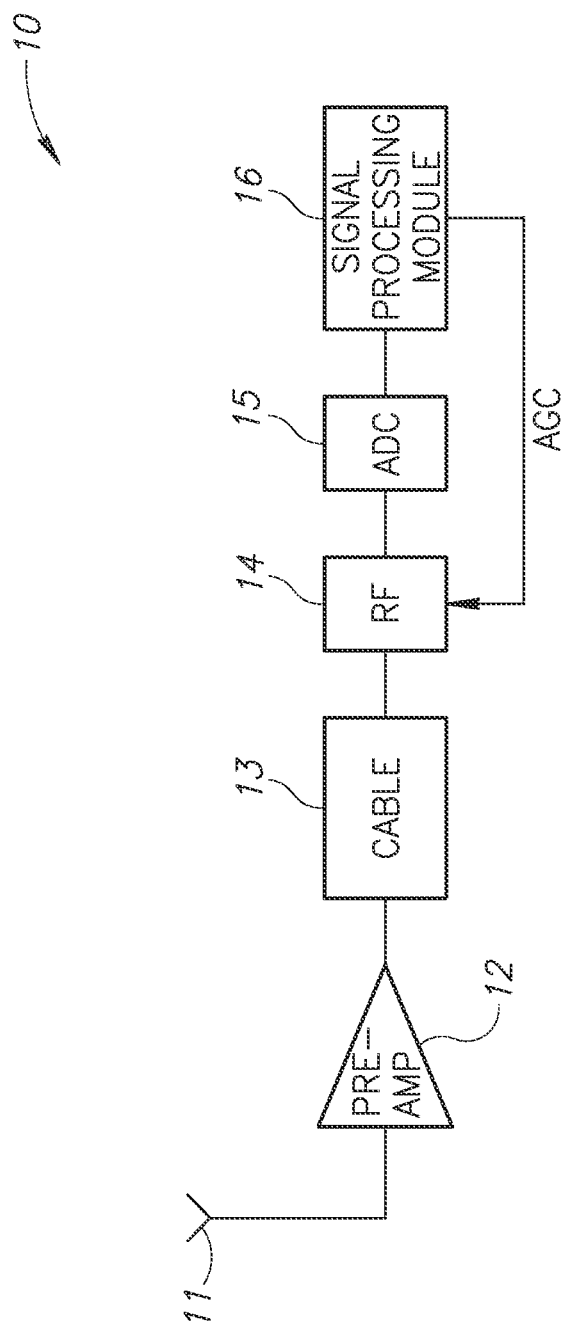
FIG. 1, a diagram illustrating schematically a receiver chain of a satellite positioning receiver.

FIG. 1 presents a diagram illustrating schematically a receiver chain 10 of a GNSS receiver 10. A receiver chain 10 can comprise an antenna 11 notably receiving the signals coming from the satellites in the L band. The antenna 11 is connected to a preamplifier 12, for example a low-noise preamplifier highly amplifying the signal in the L band. A cable 13 connects the output of the preamplifier 12 to a radiofrequency module or RF module 14. The RF module 14 filters the signal and reduces it in frequency; it also contains a variable gain amplifier, for example voltage-controlled, such as an amplifier of the type commonly denoted by the acronym VGA. The filtered signal, down-shifted into the band and amplified by the RF module 14 is then digitized by an analogue-digital converter or ADC 15. A signal processing module 16 then carries out processing on the digital signal, and notably controls the RF module 14 for the implementation of the AGC. The gain control may be carried out according to various algorithms implemented in the signal processing module 16.

Figure 2:
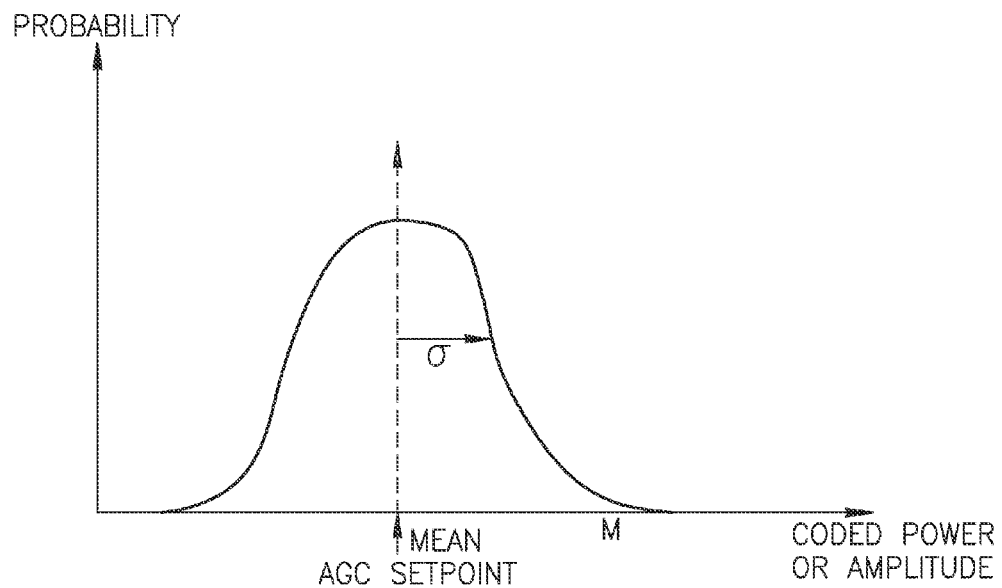
FIG. 2, a curve illustrating the probability density as a function of the power or of the amplitude, for a signal corresponding to the thermal noise alone.

FIG. 2 presents a curve illustrating the coded probability density as a function of the power or of the amplitude, for a signal corresponding to the thermal noise alone.

The digitized samples typically follow a Gaussian law with a mean power M and a standard deviation σ.

A "conventional" AGC aims to feedback control the half of the samples digitized by the ADC that are above an AGC setpoint value, and the half of the samples below the AGC setpoint value. Thus, the AGC aims to feedback control the mean power M to the AGC setpoint value.

Figure 3:
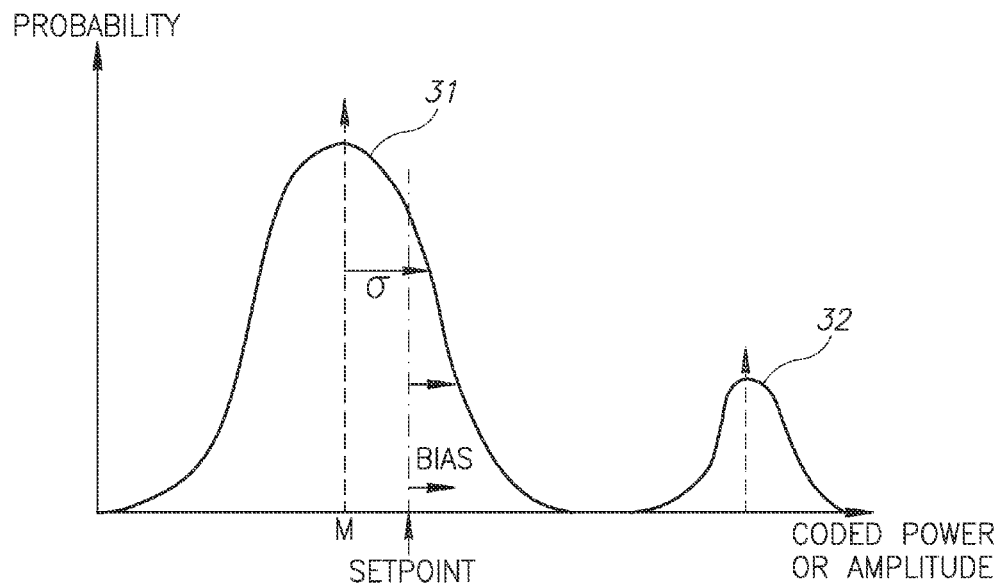
FIG. 3, the superposition of two curves illustrating the probability density as a function of the power or of the amplitude, respectively for a thermal noise signal alone and a signal including the thermal noise and signals coming from pulses within the useful band.

FIG. 3 presents a first curve 31 illustrating the probability density as a function of the coded power or amplitude, for a thermal noise signal alone. The first curve 31 is similar to the curve presented in FIG. 2 described hereinabove. A second curve 32 illustrates the probability density as a function of the power or of the amplitude, for the samples corresponding to a signal including thermal noise and signals coming from a pulse in the useful band. The second curve 32 also exhibits a substantially Gaussian aspect.

As is illustrated by FIG. 3, a "conventional" AGC is biased in the presence of pulsed interference within the band, this being due to the fact that such an AGC aims to feedback control half of the samples digitized by the ADC above an AGC setpoint value, and half of the samples below the AGC setpoint value. The bias depends on the occupancy rate of the pulses, and is higher the greater the occupancy rate of the pulses. Some AGCs can advantageously assign a higher weight to the high-power samples, and the bias can then also depend on the received power coming from the pulses.

The recourse to a blanking technique such as previously presented, prior to the estimation of the power of the AGC, allows the pulse to be "masked" and consequently a "de-biasing" of the AGC, as in a scenario of thermal noise alone as illustrated in FIG. 2.

Figure 4:
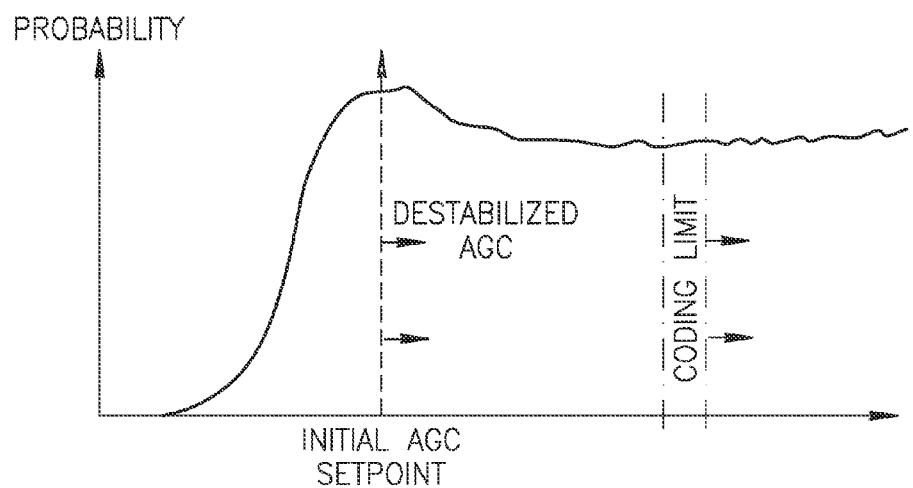
FIG. 4, a curve illustrating the probability density as a function of the power or of the amplitude, for a signal including the thermal noise and pulses of the DME type.

FIG. 4 presents a curve illustrating the probability density as a function of the power or of the amplitude, for a signal including the thermal noise and pulses of the DME type.

An AGC subjected to a typical scenario of the presence of pulses of the DME type exhibits a coded power probability such as that illustrated by the curve.

The initial AGC setpoint means that the ratio 50% of the samples above and 50% below no longer applies. The gain of the AGC therefore decreases and the coding limit—in other words the number of bits over which the noise must be coded—increases, and so on: the AGC then continues to adapt the setpoint, until the point where the initial signal is no longer coded. In such a situation, the GNSS receiver then quickly finds itself in an acquisition failure or in a loss of signal tracking situation.

According to the aforementioned technique, being the subject of the Patent application FR 2,916,589, the closed-loop control of the AGC only takes place on the left-hand part of the curve: for example, the left-hand part of the first curve 31 presented in FIG. 3, or the left-hand part of the curve presented in FIG. 4. In this way, the AGC is de-biased in the respective corresponding scenarios.

However, as has been previously described, this technique proves to be less effective when faced with scenarios of high occupancy rates of out-of-band pulses, saturating the preamplifier that operates over the whole L band. When the latter is saturated by a pulse within the L band but outside of the useful band, its gain collapses over the whole L range. In such a scenario, the coded power or amplitude probability density is illustrated in FIG. 5.

Figure 5:
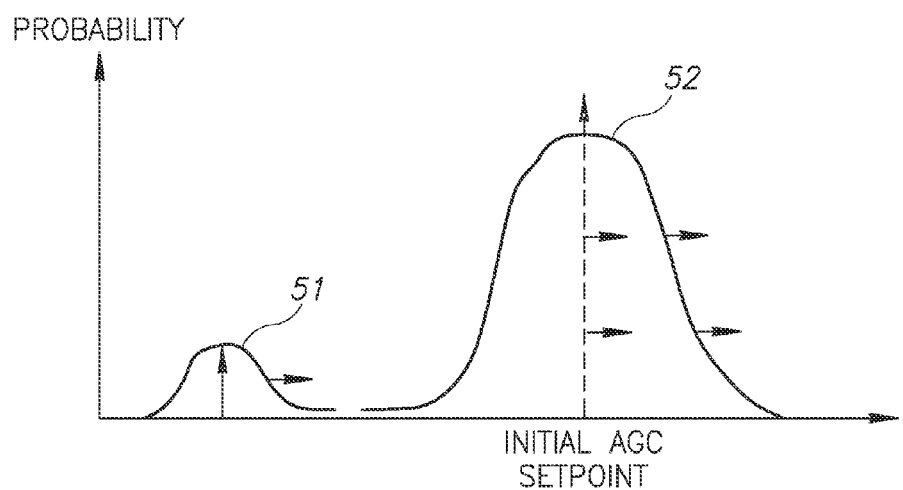
FIG. 5, the superposition of two curves illustrating the probability density as a function of the power or of the amplitude, for a thermal noise signal, respectively in the presence and in the absence of out-of-band pulses with a high occupancy rate.

FIG. 5 presents a first curve 51 illustrating the coded probability density as a function of the power or of the amplitude, for the samples corresponding to a signal including thermal noise and signals coming from an out-of-band pulse. A second curve 52 illustrates the probability density as a function of the power or of the amplitude, for samples corresponding to a signal of thermal noise alone.

As is illustrated by the first curve 51 in FIG. 5, there exists a probability following a substantially Gaussian law, such that the amplitude or the power of the sampled signal is low when in the presence of out-of-band pulses. This is due to the fact that, in the presence of out-of-band pulses typically coming from radar emissions, the gain collapses owing to the saturation of the preamplifier.

The present invention is founded on an AGC based on utilization of the "unperturbed" part of the probability density function, in other words, in the example of a scenario involving interference caused by out-of-band pulses: the part of the second curve 51 corresponding to the high-power samples, in such a manner as not to saturate the useful samples in the case of a high rate of out-of-band occupancy.

More generally, one aim of the present invention is to adapt the behaviour of the AGC, the latter being based on the probability density function of the amplitude or of the power of the sampled signals, according to the interference scenarios detected.

The principle of the present invention notably consists in adapting the GNSS receiver to scenarios of the high density of out-of-band interference type or to scenarios of the high intensity of in-band interference type, so as to improve the estimation of the thermal noise and of the continuous interference in the presence of pulsed interference sources whatever their power or their amplitude, their repetition rates and their carrier frequency.

The present invention is notably founded on the following principles:
- the filtered samples of low amplitude are not very sensitive to the pulsed interference if the pulsed out-of-band interference does not lead to compression of the analogue processing chain
- the filtered samples of high amplitude are not very sensitive to the pulsed interference if the pulsed in-band interference sources are limited in number or have low amplitudes.

It is thus possible to identify two situations that are critical for the stability of the closed-loop control of the AGC in the presence of pulsed interference:
- the case of a high density of "non-compressive" pulsed interference, in other words with a power below the point of saturation of the various RF stages, in the reception useful band, in which the control of the AGC will be closed-loop controlled on the distribution tail of the low amplitudes of the probability density of the noise, in other words the samples unaffected by the presence of the strong pulses;
- the case of strong out-of-band pulses, exceeding the point of compression of the receiver chain, whose non-linearities contribute to the deformation of the distribution tail of the amplitudes of the spectral density of the noise.

The idea of the present invention is to base the closed-loop control of the AGC on the detection of the temporal density of the pulsed interference sources, rather than on the detection of saturation of the received signal. The present invention notably intends the performance of the closed-loop control of the AGC to rely first and foremost on the distribution of the samples of high amplitude, corresponding to the distribution tail of the right-hand part of the probability density, as long as the density of received pulses is negligible. In this way, it is possible to both take the most advantage of the distribution of noise in the absence of in-band pulses while at the same time remaining robust to the risk of saturations caused by out-of-band interference.

On the other hand, if the pulsed interference density increases, the probability density corresponding to the highest amplitudes will be modified with respect to that obtained with noise alone. In this case, the idea is then to reduce this risk by performing the closed-loop control of the AGC on the basis of the distribution quantiles of the noise samples with low amplitudes, corresponding to the left-hand part of the probability density, whose estimation is not affected by interference sources with high amplitudes.

In the case of the existence of a high density of pulses in the reception band, in conjunction with the existence of out-of-band compressive pulses, since not taking into account the density of pulses in the band runs the risk of a divergence of the estimation of the AGC, the aim is to first and foremost ensure its processing, to the detriment of the identification of the compression situations. Indeed, in the end, the latter only result in an error in the closed-loop control setpoint, leading at most to a reduction of the useful dynamic range in the case where, whatever the circumstances, the simultaneous existence of pulses in the band will have mainly contributed to reducing this dynamic range.

The detection of the temporal occupancy rate of the pulses within the useful band constitutes a very practical indicator and is readily implemented. This indicator allows an alarm to be raised if the potential robustness to the compression of the RF in the scenarios of powerful pulsed out-of-band interference becomes critical for the robustness to the occupancy of pulsed interference in the band which is truly real since it is measured. When the occurrence of pulsed interference in the band becomes non-negligible, an occupancy rate detector alerts the AGC and the control of the non-linear function moves to the left of the probability density curve.

According to one particular feature of the invention, the GNSS receiver comprises means for detecting temporal occupancy rates of the pulsed interference in the useful band. The update period of the indicator of temporal occupancy rate for the pulsed interference in the useful band typically has an order of magnitude much lower than the reaction time of the AGC, the minimum ratio being typically greater than 10. The indicator of temporal occupancy rate for the pulsed interference in the useful band supplies an input data value allowing the protection from the pulses in the band to be adjusted in an optimal manner.

Thus, in the case of a scenario of pulsed interference in the band of power or of amplitude lower than the point of radiofrequency saturation, a high temporal occupancy rate of the pulsed interference in the useful band leads the AGC to be based on the left-hand part of the probability density curve in order to carry out the closed-loop control of the chain output noise level, for extrapolation of the gain control for the VGA.

For example, if the temporal occupancy rate of the pulsed interference in the useful band is equal to 80%, it is possible to regulate the control of the AGC using lower values (noise distribution quantile at 10%) so that 90% of the coded samples from the ADC have an amplitude above this setpoint.

The AGC can then carry out an estimation of the mean of the power of the noise allowing the closed-loop control of the gain of the chain (in noise) with a loop of order 1. For this purpose, the samples coming from the RF and sampled by the ADC are compared with a setpoint threshold adjusted on the basis of a Gaussian noise distribution such that 90% (in the case of the example at 10%) of the amplitude or power samples must be greater than the setpoint. The error obtained by this subtraction is processed in a non-linear manner in order to minimize the residual error, the potential "overshoot" and the time constant of the AGC. This last technique is described in the Patent application published under the reference FR 2,916,538.

The non-linear function may be defined in the following manner: the amplitude samples below the threshold can for example be weighted with a weight of 0.9, whereas the amplitude samples above the threshold will be weighted with a weight of 0.1. The closed-loop control of the AGC loop thus finds a point of equilibrium where the difference between the two amplitude distributions equals 0 (such an adjustment is denoted "10%/90%"). In a similar manner, an adjustment according to which the negative differences are weighted with a weight X, and the positive weights with a weight 1−X, can be denoted "X %/(1−X) %".

Equally, in the aforementioned example of a scenario of in-band pulsed interference sources that are few in number or have low amplitudes, in other words when the temporal occupancy rate of the pulsed interference in the useful band is low, the aim of the AGC is to try and detect the right-hand part of the probability density curve, then to extrapolate the control for the VGA. In this case, it is for example possible to weight the negative differences with a weight of 0.1 and the positive differences with a weight 0.9, in other words according to a "90%/10%" adjustment.

According to one particular feature of the present invention, the weightings applied to the differences can be modified in real time as a function of the density of pulsed interference sources in the useful band. The criterion representative of the scenario is the occupancy rate of the pulses within the useful band. This indicator can be adjusted in an optimal manner so as to furthermore ensure the best possible robustness to the "compressive" out-of-band interference sources, in other words with a power greater than the point of saturation of the various RF stages.

The adjustments can for example be made according to the Table (1) presented hereinafter forming a truth table and displaying the adjustments that may be applied to the weighting of the differences, as a function of the detected occupancy rate of the pulses within the useful band:

(1)

| | Occupancy rate | | | | | | | | |
|---|---|---|---|---|---|---|---|---|---|
| Adjustment | 10 | 20 | 30 | 40 | 50 | 60 | 70 | 80 | 90 |
| 10%/90% | XO | X | X | X | X | X | X | X | X |
| 17%/83% | XO | X | X | X | X | X | X | X | |
| 25%/75% | XO | XO | X | X | X | X | | | |
| 50%/50% | XO | XO | XO | XO | | | | | |
| 75%/25% | XO | XO | XO | O | O | O | O | | |
| 83%/17% | XO | O | O | O | O | O | O | O | |
| 90%/10% | XO | O | O | O | O | O | O | O | O |

In the Table (1) hereinabove, the "X"s represent acceptable adjustments for pulses within the useful band, and the "O"s represent acceptable adjustments for out-of-band pulses above the point of saturation of the RF module, the columns being applicable at various detected occupancy rates.

The priority is given to the processing of high densities of pulses in the band (the 10%/90% adjustment for example), the most correct adjustment of the setpoints then supplying the best robustness to the case of the out-of-band compressive pulses, which corresponds to an operational case of DME interference, typical in aeronautics, for the frequency bands: L5/E5a, E5b.

Figure 6:
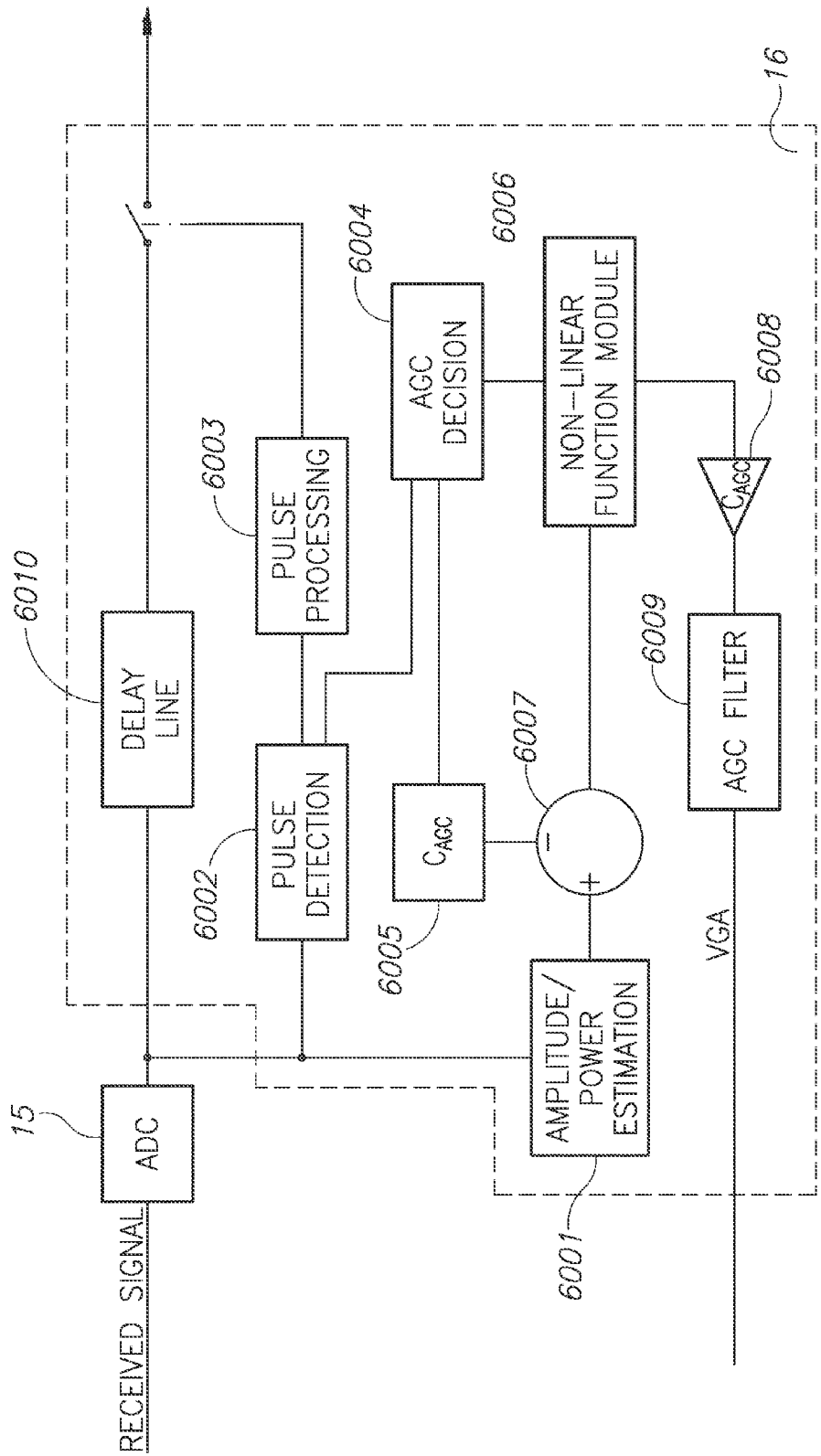
FIG. 6, a functional diagram illustrating one example of architecture of a GNSS receiver comprising an AGC according to a first exemplary embodiment of the invention.

FIG. 6 presents a functional diagram illustrating one example of architecture of a GNSS receiver comprising an AGC according to a first exemplary embodiment of the invention.

An input signal, for example coming from the RF module 14 with reference to FIG. 1 described previously, is applied to the input of the ADC 15. The signal processing module 16 notably returns a control signal from the AGC to the RF module 14, as is previously described with reference to FIG. 1. The ADC 15 disposes of a sufficient number of bits for correctly coding the useful signal, and also the pulses of power or of amplitude greater than that of the thermal noise. The ADC 15 can advantageously code continuous interference signals, if the GNSS receiver is designed for digitally eliminating them, via for example the integration of a filter with finite pulse response, commonly denoted according to the acronym FIR, at the output of the ADC 15.

The signal processing module 16 comprises a module for amplitude or power estimation 6001 estimating the coded signal coming from the ADC 15. The estimation of the amplitude or of the power of the signal coded by the ADC 15 can be carried out according to various techniques known per se, depending on the choices of receiver architecture notably according to production cost and power consumption criteria. This estimation can be carried out by dedicated electronics, or else in a programmable logic circuit of the FPGA type, according to the acronym for "Field Programmable Gate Array", or again via a dedicated software application implemented in a microcontroller. This estimation is carried out using the maximum amount of information on the temporal shape of the pulsed interference, in order that the occupancy rate is the lowest possible. If these pulses are processed later by frequency processing or blanking for example, a delay line 6010 can be implemented in order to take into account the latency induced by the detection of the pulses.

The coded signal coming from the ADC 15 is also applied at the input of a module for detection of pulses within the useful band 6002. The detection of pulses in the band can be carried out so as to be more or less matched to the shape of the interference in the band. It should be noted that the out-of-band interference sources are not visible to the module for detection of pulses within the useful band 6002 since they have been filtered by the radiofrequency filters comprised in the RF module, and may potentially have saturated the preamplifiers. In this case, the useful signal is not coded: the samples will be composed of noise generated by the last RF stages. The module for detection of pulses within the useful band 6002 notably allows the calculation of an indicator of occupancy rate for the pulses within the useful band to be implemented.

The module for detection of pulses within the useful band 6002 is connected to a module for processing the pulses 6003. The pulse processing module 6003 can implement various techniques known per se for processing pulses, such as methods for peak-clipping, blanking, spectral excision, power inversion, etc.

An AGC decision module 6004 receives at its input a value for occupancy rate of the pulses within the useful band, returned by the module for detection of pulses within the useful band 6002. The ACG decision module 6004 constitutes a particular feature of the present invention. It returns at its output a setpoint for $C_{AGC}$ 6005 and signals intended for a non-linear function module 6006. The non-linear function module 6006 implements a non-linear function, for example adapting the weight assigned to the negative errors or by saturating the residues, as previously described. The decision algorithm can for example be based on the Table (1) presented hereinabove. The non-linear function implemented in the non-linear function module 6006 may for example give more weight to negative samples than to positive samples, or it may saturate the error in a dissymmetric manner, etc.

A comparator 6007 carries out a comparison between the setpoint $C_{AGC}$ 6005 and the coded amplitude or power returned by the amplitude or power estimation module 6001.

The non-linear function module 6006 also returns at its output an AGC control signal to an AGC loop gain module 6008, the gain of the AGC loop allowing a response time to be fixed for the AGC loop. The consequence of a high gain will be a very reactive loop in the case of a continuous interference, but which can also react in the case of a long pulsed interference (typically of duration longer than 1 ms): the AGC is then in danger of "pumping" at each pulse. Advantageously, the gain of the AGC loop can be adjusted as a function of the temporal occupancy rate of pulses within the useful band Advantageously, the AGC control signal can be filtered by an AGC filter 6009, for example formed by an infinite integrator with saturation allowing the sensitivity of the control to the presence of pulses to be reduced.

The principle of operation of the architecture presented in FIG. 6 may thus be summarized in the following manner: for a sample returned by the ADC 15, an estimation of its amplitude or of its power is performed by the amplitude or power estimation module 6001. The value returned by the amplitude or power estimation module 6001 is then compared with the setpoint value $C_{AGC}$ 6005. The comparison consists for example of a subtraction of the setpoint value $C_{AGC}$ 6005. If the result or difference is negative, the non-linear function module 6006 returns at its output a value weighted by a factor of X %; if the difference is positive, then the non-linear function module 6006 returns at its output the value weighted by a factor of (1−X) %, the value of X corresponding to the adjustment applied by the non-linear function implemented in the non-linear function module 6006, this adjustment being determined by an AGC decision module 6004, depending on the value of the temporal occupancy rate of the pulses within the useful band.

Advantageously, the setpoint value $C_{AGC}$ 6005 can be adapted to the interference scenario, via a suitable command sent by the AGC decision module 6004. The adaptation can be carried out via the implementation of a truth table, or else of arithmetic formulae. For example, the AGC setpoint value will typically be increased by 20% in the scenarios with virtually zero interference, and conversely, decreased by 20% in scenarios with a high level interference.

Figure 7:
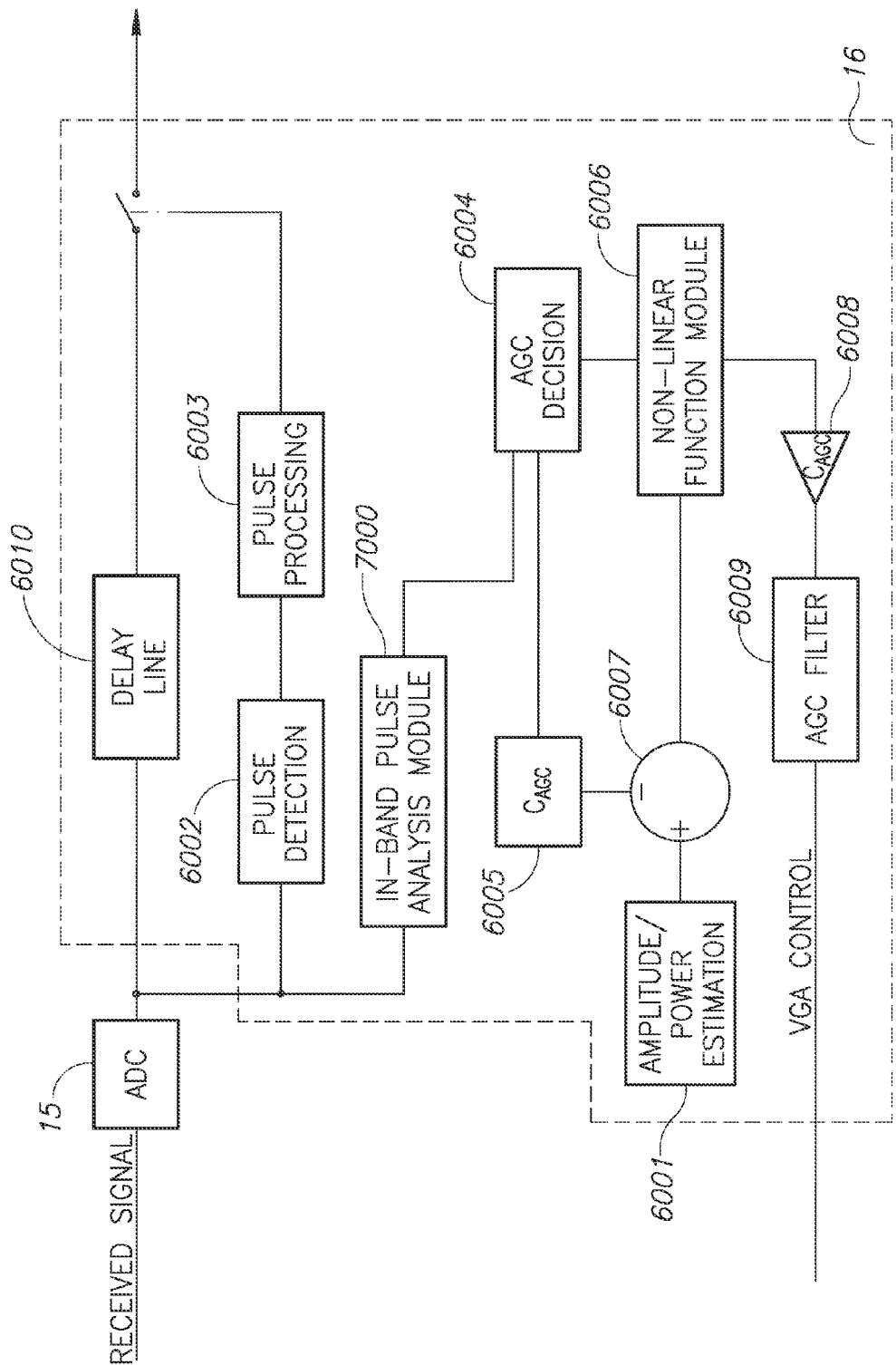
FIG. 7, a functional diagram illustrating one example of architecture of a GNSS receiver comprising an AGC according to a second exemplary embodiment of the invention.

FIG. 7 presents a functional diagram illustrating one example of architecture of a GNSS receiver comprising an AGC according to a second exemplary embodiment of the invention. The architecture illustrated in FIG. 7 is similar to the architecture described beforehand with reference to FIG. 6, and notably comprises all the elements shown in FIG. 6. However, a module for analyzing the pulses within the useful band 7000, also comprising filtering means, can be inserted between the ADC 15 and the AGC decision module 6004. The module for analyzing the pulses within the useful band 7000 can be dedicated to the analysis of the pulses within the useful band: it can be based on a measurement of amplitude or of power which is subsequently compared with the estimation of amplitude or of power of the thermal noise and of any potential continuous interference; it can equally be based on a spectrally adapted filter, etc., and thus allow a more reliable indicator of the occupancy rate of the pulses to be obtained. The module for analyzing the pulses within the useful band 7000 can comprise filtering means adapted to the shape of each type of pulse. The DME interference sources (the most critical for the new signals dedicated to aeronautical applications) are for example formed by two pulses of Gaussian shape separated by 12 µs. Radar pulses are usually formed by series of square pulses: for example, a train of pulses of a few microseconds emitted in packets of ten.

The invention claimed is:

1. An automatic gain control device for satellite positioning receivers comprising at least one radiofrequency module returning a filtered radiofrequency signal representative of the signals received by an antenna and amplified by a variable gain amplifier comprised in the radiofrequency module, an analog-digital converter returning digitized samples of the radiofrequency signal, and a signal processing module processing the digitized signal, the automatic gain control device being implemented in the signal processing module and performing a closed-loop control returning a gain control signal for the variable gain amplifier, and comprising means for estimating the temporal occupancy rate of the pulses within the useful band, means for estimating a characteristic quantity chosen from within the group comprising the amplitude and the power of the sampled signals, the temporal occupancy rate of the pulses within the useful band determining the weighting respectively applied to the negative and positive differences resulting from a comparison between the characteristic quantity of the digitized samples and a setpoint value $C_{AGC}$ by a non-linear function module, the signals coming from the non-linear function module being integrated over a given period in order to form the said gain control signal.

2. The automatic gain control device according to claim 1, wherein the determination of the weightings is implemented in an AGC decision module receiving at its input a value for pulse occupancy rate in the useful band, and returning at its output weighting information to the said non-linear function module.

3. The automatic gain control device according to claim 1, wherein the non-linear function module applies the weightings based on a truth table of correspondence between temporal occupancy rates of the pulses within the useful band, and adjustments to the respective rates from weightings applied to the said negative and positive differences.

4. The automatic gain control device according to claim 2, wherein the non-linear function module applies the weightings based on a truth table of correspondence between temporal occupancy rates of the pulses within the useful band, and adjustments to the respective rates from weightings applied to the said negative and positive differences.

5. The automatic gain control device according to claim 3, wherein weighting adjustments apply a weighting rate of X % to the negative differences and a weighting rate of (1−X) % to the positive differences, X being in the range between 0 and 100, and being higher the greater the temporal occupancy rate of the pulses within the useful band.

6. The automatic gain control device according to claim 4, wherein weighting adjustments apply a weighting rate of X % to the negative differences and a weighting rate of (1−X) % to the positive differences, X being in the range between 0 and 100, and being higher the greater the temporal occupancy rate of the pulses within the useful band.

7. The automatic gain control device according to claim 1, comprising means for adjustment of the setpoint value $C_{AGC}$ configured for adjusting the value of the setpoint $C_{AGC}$ as a function of the temporal occupancy rate of the pulses within the useful band.

8. The automatic gain control device according to claim 1, wherein the determination of the temporal occupancy rate of the pulses within the useful band is implemented in a module for detection of pulses within the useful band comprised in said signal processing module.

9. The automatic gain control device according to claim 1, wherein the determination of the temporal occupancy rate of the pulses within the useful band is implemented in a module for analyzing the pulses within the useful band comprising at least one filter spectrally adapted to predetermined types of pulsed interference.

10. The automatic gain control device according to claim 2, wherein closed loop control comprises an AGC loop gain module whose adjustable gain determines the response time of the closed loop control.

11. The automatic gain control device according to claim 8, wherein the gain of the loop gain module is adjusted by a control signal returned by the AGC decision module as a function of the temporal occupancy rate of the pulses within the useful band.

* * * * *